United States Patent
Correale, Jr. et al.

(10) Patent No.: US 7,501,850 B1
(45) Date of Patent: Mar. 10, 2009

(54) SCANNABLE LIMITED SWITCH DYNAMIC LOGIC (LSDL) CIRCUIT

(75) Inventors: Anthony Correale, Jr., Raleigh, NC (US); Thomas A. Dick, Raleigh, NC (US); Sven E. Meier, Boston, MA (US); Robert K. Montoye, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/961,548

(22) Filed: Dec. 20, 2007

(51) Int. Cl.
*H03K 19/00* (2006.01)
(52) U.S. Cl. .............................. 326/16; 326/97; 326/96
(58) Field of Classification Search ........................ None
See application file for complete search history.

(56) References Cited

U.S. PATENT DOCUMENTS 7,372,305 B1 * 5/2008 Ngo et al. ...................... 326/98

2008/0012601 A1 * 1/2008 Sumita ........................ 326/105

* cited by examiner

*Primary Examiner*—Anh Q Tran
(74) *Attorney, Agent, or Firm*—Cantor Colburn LLP; John Cockburn

(57) ABSTRACT

A scannable limited switch dynamic logic (LSDL) circuit including a data input and a data output, a combinational logic circuit in communication with the data input, a pre-charge circuit in communication with the combinational logic circuit, a footer circuit in communication with the combinational logic, a keeper circuit in communication with the combinational logic circuit and the pre-charge circuit, a scan input connected to the data input, a scan input circuit in communication with the scan input, the combinational logic circuit, the pre-charge circuit, and the keeper circuit, a modified inverter circuit in communication with the combinational logic circuit, the pre-charge circuit, the keeper circuit, and the scan input circuit, a parallel gate circuit in communication with the modified inverter circuit, a series gate circuit in communication with the modified inverter circuit and the parallel gate circuit, a feedback inverter connected between an internal node and a feedback node, and an output buffer connected between the internal node and the data output.

6 Claims, 2 Drawing Sheets

SCANNABLE LIMITED SWITCH DYNAMIC LOGIC (LSDL) CIRCUIT

BACKGROUND OF THE INVENTION

1. Field of the Invention

This invention relates generally to digital logic circuitry, and particularly to a scannable limited switch dynamic logic (LSDL) circuit.

2. Description of Background

Digital logic circuitry is used for many purposes, particularly, for example, in computer devices. With such extensive usage, the ability to routinely test digital logic circuits for proper operation is desirable, for example, when initially testing newly fabricated digital logic circuitry or when powering up or operating a device that includes this circuitry, such as a computer. Designing so-called "scannable" circuits is an example of a popular technique to provide such routine testing capability. In scannable digital logic circuits, additional circuitry is included to ensure the typical operation of the circuit is free of malfunctions, for example, prior to the normal operation of the circuit.

Limited switch dynamic logic (LSDL) is a hybrid combination of static logic circuitry (e.g., non-time-varying or sequential circuits, such as a so-called "latch" circuit) and dynamic logic circuitry (e.g., time-varying or "clocked" circuits, such as a so-called "domino" circuit). Thus, a basic LSDL circuit includes the combination of a latch circuit and a domino circuit. LSDL circuits offer desirable characteristics when used for digital logic circuitry, such as fast operation and low power consumption. However, scannable LSDL circuit designs can result in undesired impacts on these characteristics and, therefore, scannable LSDL circuit designs that maintain these beneficial characteristics are desirable.

SUMMARY OF THE INVENTION

A scannable limited switch dynamic logic (LSDL) circuit is provided. An exemplary embodiment of the circuit includes a data input and a data output, a combinational logic circuit in communication with the data input, a pre-charge circuit in communication with the combinational logic circuit, a footer circuit in communication with the combinational logic, a keeper circuit in communication with the combinational logic circuit and the pre-charge circuit, a scan input connected to the data input, a scan input circuit in communication with the scan input, the combinational logic circuit, the pre-charge circuit, and the keeper circuit, a modified inverter circuit in communication with the combinational logic circuit, the pre-charge circuit, the keeper circuit, and the scan input circuit, a parallel gate circuit in communication with the modified inverter circuit, a series gate circuit in communication with the modified inverter circuit and the parallel gate circuit, a feedback inverter connected between an internal node and a feedback node, and an output buffer connected between the internal node and the data output.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

According to exemplary embodiments of the invention described herein, a scannable limited switch dynamic logic (LSDL) circuit is provided. In accordance with such exemplary embodiments, the LSDL circuit is configured to be fully scannable according to various scan modes while still maintaining the desirable benefits of LSDL circuits such as fast operation and low power consumption.

Figure 1:
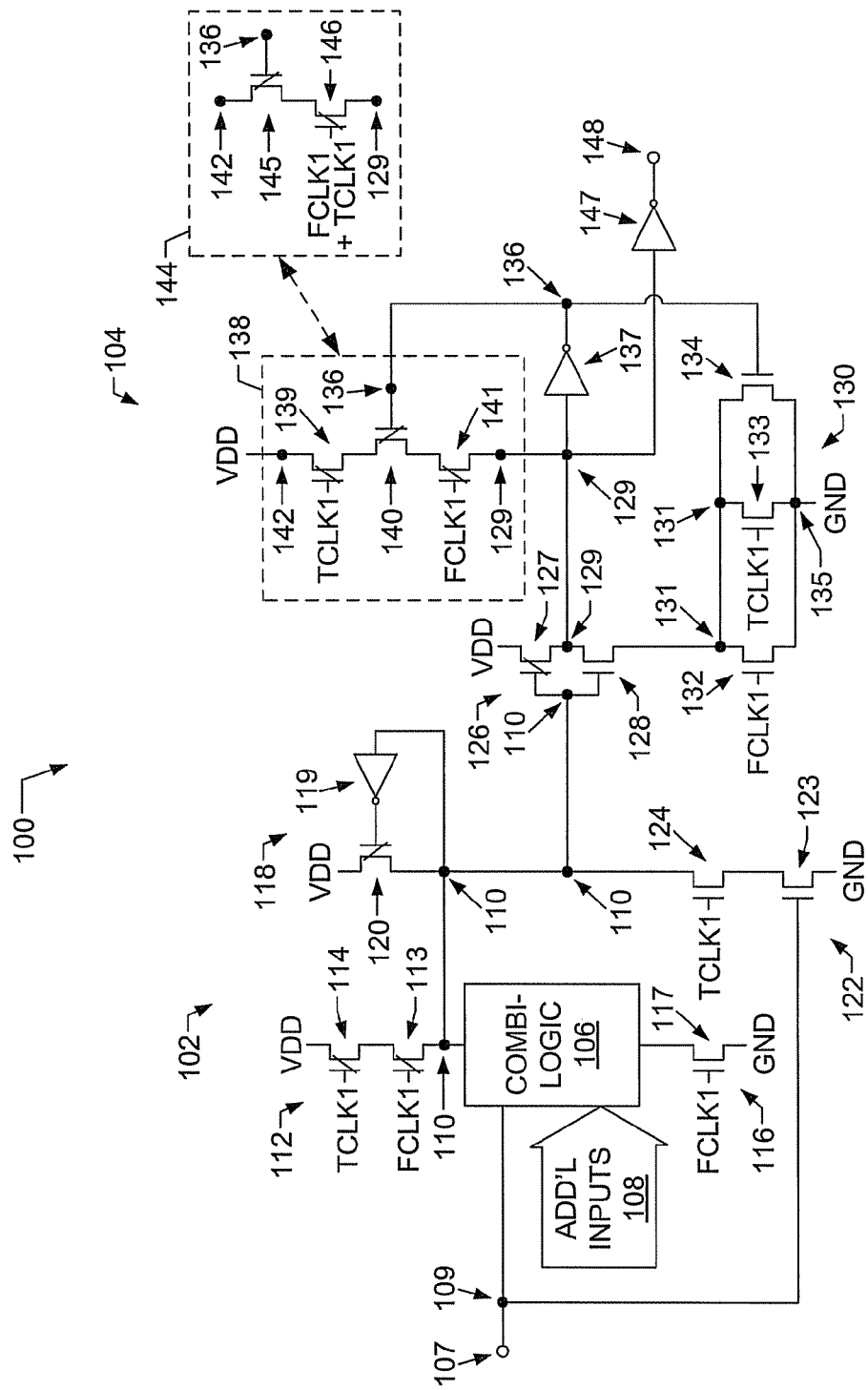
FIG. 1 is a schematic diagram illustrating an example of a scannable limited switch dynamic logic (LSDL) circuit.

Turning now to the drawings in greater detail, wherein like reference numerals indicate like elements, FIG. 1 illustrates an example of a scannable limited switch dynamic logic (LSDL) circuit 100. It should be understood, in light of the description of exemplary embodiments, that the terms "circuit" and "circuitry" used herein may represent one or more circuits, circuitries, etc., or one or more elements thereof. The exemplary scannable LSDL circuit 100 includes dynamic logic circuitry ("domino circuitry") 102 and static logic circuitry ("latch circuitry") 104. The domino circuitry 102 includes a combinational logic circuit ("combinational logic") 106, which may include one or more switches, logic gate circuits, etc. For example, in some embodiments, the combinational logic 106 may include an N-stack circuit that includes a plurality of n-type transistors connected in a combinational (or combinatorial) cluster. Furthermore, the combinational logic 106 may form all or a portion of an arithmetic logic unit (ALU) of a computer, as may the scannable LSDL circuit 100 itself. The scannable LSDL circuit 100 includes a functional ("data") input 107 and may include additional inputs 108, all of which are in communication with the combinational logic 106. Input 107 is also connected to a test ("scan") input circuit 122 of the scannable LSDL circuit 100 via scan input node 109. In some embodiments, node 109 may not be connected to input 107 or may be connected, alternately or additionally, to another input of the scannable LSDL circuitry 100, such as one or more of the additional inputs 108.

The domino circuitry 102 also includes a pre-charge circuit 112 connected to the combinational logic 106 via node 110. The pre-charge circuit 112 includes p-type switch 113, which is controlled by a first functional clock FCLK1 connected to its gate terminal, and p-type switch 114, which is controlled by a first test clock TCLK1 connected to its gate terminal (where each clock provides, e.g., a pulse signal between logic-1 and logic-0 or a constant signal value dependent on its mode of usage). As depicted, switch 113 is connected in series with switch 114 via their source/drain terminals, and switch 114 is also connected to a voltage source VDD (e.g., providing a logic-1 signal) via one of its source/drain terminals. The domino circuitry 102 further includes a footer circuit 116 that is connected to the combinational logic 106 and includes an n-type switch 117 that is also controlled by functional clock FCLK1 connected to its gate terminal. The n-type switch 117 is also connected to a ground GND (e.g., providing a logic-0 signal) as depicted.

The domino circuitry 102 also includes a keeper circuit 118 that is connected to node 110. The keeper circuit includes an inverter 119 and a p-type switch 120 that is controlled by the output of the inverter 119, which is connected to the gate terminal of switch 120. Switch 120 is also connected to voltage source VDD via one of its source/drain terminals as depicted.

Scan input circuit 122 is connected in parallel with combinational logic 106 via node 109 and node 110. Scan input circuit 122 includes a first n-type switch 123, which is controlled by an input signal via node 109 that is connected to its gate terminal. Switch 123 is connected to ground GND and a second n-type switch 124 of the scan input circuit 122 via its source/drain terminals. Switch 124 is controlled by test clock TCLK1 that is connected to its gate terminal and is also connected to node 110 via one of its source/drain terminals as depicted. Node 110 is an intermediate node of the scannable LSDL circuit 100 between the domino circuitry 102 and the latch circuitry 104.

The latch circuitry 104 is connected to the domino circuitry 102 via node 110 and includes a modified inverter circuit 126. The modified inverter circuit 126 includes a p-type switch 127 connected in parallel with an n-type switch 128 between nodes 110 and 129 via their gate terminals, where node 129 is an internal node of the latch circuitry 104. Switch 127 is further connected to voltage source VDD via one of its source/drain terminals. Switch 128 is further connected to a parallel gate circuit 130 via one of its source/drain terminals connected to node 131. Gate circuit 130 includes n-type switches 132, 133, 134 connected in parallel between nodes 131 and 135, where node 135 is also connected to ground GND. Switch 132 is controlled by functional clock FCLK1 connected to its gate terminal, and switch 133 is controlled by test clock TCLK1 connected to its gate terminal. Switch 134 is controlled via its gate terminal connection at node 136 to the output of feedback inverter 137, where node 136 is a feedback node within the latch circuitry 104. The input of feedback inverter 137 is connected to internal node 129.

The latch circuitry 104 also includes a series gate circuit 138 that includes p-type switches 139, 140, 141 in series via their respective source/drain terminals. Switch 139 is controlled by test clock TCLK1 connected to its gate terminal and one of its source/drain terminals is connected to voltage source VDD at node 142. Switch 141 is controlled by functional clock FCLK1 connected to its gate terminal, and switch 140 is controlled via its gate terminal connection at node 136 to the output of inverter 137.

In some embodiments, series gate circuit 138 can be replaced by a second series gate circuit 144 alternately connected between nodes 129, 136, 142. Gate circuit 144 includes two switches 145, 146 connected in series. Switch 145 can be connected to node 136 at its gate terminal and node 142 at one of its source/drain terminals. Switch 146 can be connected to node 129 at one of its source/drain terminals and is controlled by the logic-OR combination of functional clock FCLK1 and test clock TCLK1 inputted to its gate terminal, where the logic-OR combination may be obtained, e.g., from the output of a logic-OR gate or an equivalently functioning circuit whose inputs are connected to functional clock FCLK1 and test clock TCLK1. Latch circuit 104 also includes output buffer 147, which is an inverter connected at its input to node 129 and at its output to output terminal (or "data output") 148 of the scannable LSDL circuit 100.

Figure 2:
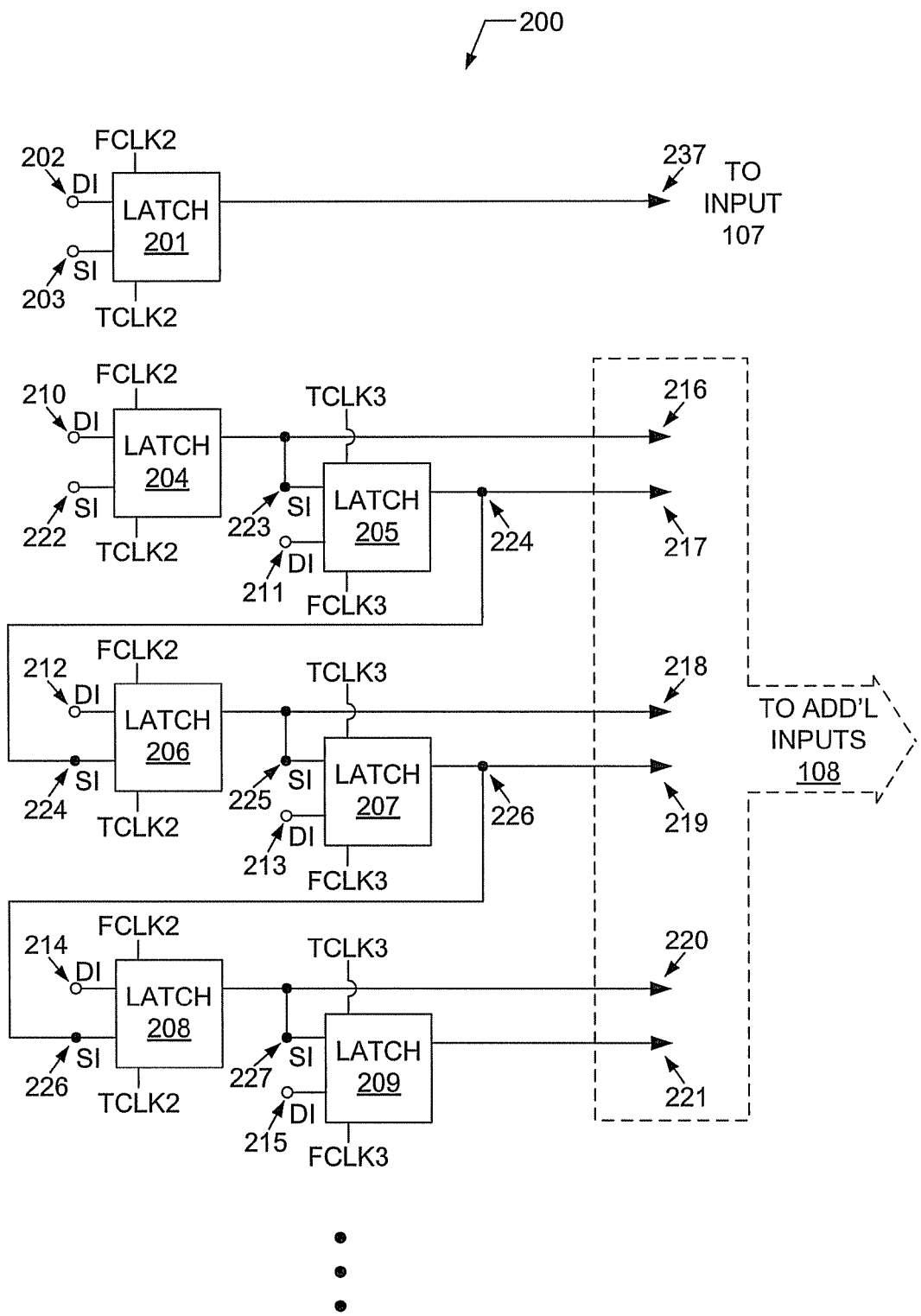
FIG. 2 is a schematic diagram illustrating an example of an input circuitry for the scannable LSDL circuit of FIG. 1.

FIG. 2 illustrates an example of an input circuitry 200 for the scannable LSDL circuit 100 of FIG. 1. The exemplary input circuitry 200 includes a first latch circuit ("latch") 201 that includes a data port ("data input" or "DI") 202, a scan port ("scan input" or "SI") 203, and an output 237, which can be connected to input node 107 of the scannable LSDL circuit 100 as indicated. Latch 201 also includes a functional clock input connected to a second functional clock FCLK2 and a test clock input connected to a second test clock TCLK2.

The input circuitry 200 further includes latch circuits ("latches") 204, 205, 206, 207, 208, 209 configured in cascaded pairs, and may include fewer or more latches in some embodiments. Latches 204, 205, 206, 207, 208, 209 include data input 210, 211, 212, 213, 214, 215, scan input 222, 223, 224, 225, 226, 227, and output 216, 217, 218, 219, 220, 221 respectively. Furthermore, latches 204, 206, 208 each include functional and test clock inputs connected to the second functional clock FCLK2 and the second test clock TCLK2 respectively, and latches 205, 207, 209 each include functional and test clock inputs connected to a third functional clock FCLK3 and a third test clock TCLK3 respectively. As indicated, latch outputs 216, 217, 218, 219, 220, 221 can be connected to the additional inputs 108 at combinational logic circuit 106 of the scannable LSDL circuit 100. Additionally, latch output 216 is connected to scan input 223, latch output 217 is connected to scan input 224, latch output 218 is connected to scan input 225, latch output 219 is connected to scan input 226, and latch output 220 is connected to scan input 227 in a "scan-chain" configuration of the latch pair outputs to the latch pair scan inputs. In some embodiments, additional latch pairs may be similarly interconnected between output and input. Furthermore, output node 148 of scannable LSDL circuit 100 can be connected to another latch or an additional scannable LSDL circuit 100 to continue the scan chain to other circuitry, e.g., of a computer.

One or more of latches 201, 204, 205, 206, 207, 208, 209 may be configured as a polarity hold latch or a similarly functioning variation thereof. In some embodiments, one or more of latches 201, 204, 205, 206, 207, 208, 209 may be configured as the scannable LSDL circuit 100. Furthermore, as will discussed below, in some embodiments, one or more of latches 201, 204, 205, 206, 207, 208, 209 may be configured as a level sensitive scan design (LSSD) L1, L2, or L2* ("L2-star") type latch depending on characteristics of the clock inputs, data inputs, and/or scan inputs. For example, in some embodiments, latches 201, 204, 206, 208 may be configured as L1 latches, while latches 205, 207, 209 and scannable LSDL circuit 100 may be configured as L2 or L2-star latches.

It should be understood that, in some embodiments, functional clocks FCLK1, FCLK2, FCLK3 are out of phase with test clocks TCLK1, TCLK2, TCLK3 respectively, e.g., by some fraction of a cycle (such as ¼, ½, etc.), and may be in/out of phase in some other combination/relationship in other embodiments. Such examples will be further described below with respect to exemplary operation of the scannable LSDL circuit 100 and input circuitry 200.

The exemplary scannable LSDL circuit 100 can be scanned according to various modes (conventions, schemes, etc.) that are based on characteristics of one or more data ports ("inputs"), scan inputs, and/or clock inputs. For example, based on the operational timing relationship of the functional clock input FCLK1 and test clock input TCLK1, the scannable LSDL circuit 100 can be configured to be scanned according to a general scan mode or an LSSD mode.

Table 1 lists a brief exemplary description of the input characteristics for various latch types in accordance with an LSSD scan mode.

TABLE 1

| Brief description of LSSD latch types. | |
| --- | --- |
| LSSD LATCH TYPE | DESCRIPTION |
| L1 | Includes A-clock scan port ("input") and optional additional system inputs, where A-clock is used exclusively for scan. |
| L2 | Includes B-Clock scan input exclusively, where B-clock input may alternately be the logic-OR combination of the B-clock and a system clock. |
| L2-STAR | Includes B-clock scan input and additional system inputs |

In an exemplary LSSD scan mode, the A-clock ("A") and a first system clock ("C1") are activated in a mutually exclusive manner whereby the A-clock ("A") is used in a test mode and the first system clock ("C1") is used in a functional mode. Similarly, the B-clock ("B") and a second system clock ("C2") are activated in a mutually exclusive manner whereby the B-clock ("B") is used in the test mode and the second system clock ("C2") is used in the functional mode. Based on the foregoing, Table 2 lists exemplary clock input characteristics (e.g., operational timing relationships) for the scannable LSDL circuit 100 in accordance with an exemplary LSSD scan mode.

TABLE 2

Exemplary clock inputs for scannable LSDL circuit 100 in accordance with an exemplary LSSD scan mode.

| LSSD LATCH TYPE | FCLK1 | TCLK1 |
| --- | --- | --- |
| L1 | C1 | A |
| L2, L2-STAR | C2 | B |
| L2, L2-STAR configured as L1, L1-STAR | C1 | A |

In an exemplary general scan mode, the A-clock is activated mutually exclusive of the first (or C1) system clock activation (as described above) and the B-clock is the inverse of the A-clock. For example, Table 3 lists exemplary clock input characteristics for the scannable LSDL circuit 100 in accordance with an exemplary general scan mode.

TABLE 3

Exemplary clock inputs for scannable LSDL circuit 100 in accordance with an exemplary general scan mode.

| LATCH TYPE | FCLK1 | TCLK1 |
| --- | --- | --- |
| L1 | C1 | A |
| L2, L2-STAR | C2 | A-INV |
| L2, L2-STAR configured as L1, L1-STAR | C1 | A |

Based on the foregoing examples, illustrated with respect to Tables 2 and 3, similar examples can be illustrated for the scannable LSDL circuit 100 when connected to the exemplary input circuitry 200. For example, Table 4 lists exemplary clock input characteristics for the scannable LSDL circuit 100 and input circuitry 200 in accordance with an exemplary LSSD scan mode where latches 201, 204, 206, 208 are configured as L1 latches and latches 205, 207, 209, and scannable LSDL circuit 100 are configured as L2-star latches (i.e., L1/L2-star latch pairs).

TABLE 4

Exemplary clock inputs for scannable LSDL circuit 100 and input circuitry 200 in accordance with an exemplary LSDL scan mode with L1/L2-star latch pairs.

| FCLK1 | FCLK2 | FCLK3 | TCLK1 | TCLK2 | TCLK3 |
| --- | --- | --- | --- | --- | --- |
| C2 | C1 | C1 | B | A | B |

As another example, Table 5 lists exemplary clock input characteristics for the scannable LSDL circuit 100 and input circuitry 200 in accordance with an exemplary LSSD scan mode where latches 201, 204, 205, 206, 207, 208, 209 are configured as L2 latches in a functional mode and scannable LSDL circuit 100 is configured as an L1 latch (i.e., L2 latches driving an L1 latch). In such configuration, scan inputs 223, 225, 227 of latches 205, 207, 209 respectively would be connected to outputs of additional L1 configured latches (not depicted) instead of outputs 216, 218, 220 of latches 204, 206, 208 respectively so that the scan inputs of the L2 latches are driven by the outputs of L1 latches.

TABLE 5

Exemplary clock inputs for scannable LSDL circuit 100 and input circuitry 200 in accordance with an exemplary LSDL scan mode with L2 latches driving an L1 latch.

| FCLK1 | FCLK2 | FCLK3 | TCLK1 | TCLK2 | TCLK3 |
| --- | --- | --- | --- | --- | --- |
| C1 | C2 | C2 | A | B | A |

In a fully LSSD scannable embodiment, a first scannable LSDL circuit 100 can drive the input 107 of a second scannable LSDL circuit 100, where the clock inputs for the first circuit 100 are configured to provide an L1-type latch and the clock inputs for the second circuit 100 are configured to provide and L2-star type latch, e.g., based on the clock inputs listed above in Table 3. Other such fully scannable embodiments can also be provided by varying the input characteristics accordingly. Furthermore, similar examples to the above input listings for an LSSD scan mode can be illustrated for general scan or other scan modes based on the disclosure herein.

In an exemplary functional mode operation of the scannable LSDL circuit 100, for example, configured as an LSSD L2-star latch, the test clock TCLK1 (in this example, the "B-clock") is set to logic-0. As a result, p-type switches 114, 139 are active and the nodes between switch 113 and 114 and switch 139 and 140 are set to logic-1 via voltage source VDD, while n-type switches 124, 133 are not active. In this mode, the scannable LSDL circuit 100 can function as an LSDL circuit according to the inputs to input node 107 and additional inputs 108 and the status of the functional clock FCLK1 (in this example, the "C2 clock").

In an exemplary scan mode of the foregoing L2-star LSSD configuration of the scannable LSDL circuit 100, both the C2 clock and B-clock are initially set to logic-0, which activates the switches 113, 114 of pre-charge circuit 112 and charges node 110 to logic-1 via voltage source VDD. When the B-clock rises to logic-1, the pre-charge circuit 112 is deactivated via switch 114. Since pre-charged node 110 is within the dynamic logic circuitry 102, node 110 is dynamic (i.e., the charge condition is not consistently held statically). However, when node 110 is charged to logic-1, keeper circuit 118 is activated via inverter 119 and switch 120 to keep node 110 charged if the scan input at node 109 is at logic-0. When the scan input 109 rises to logic-1, for example, as a result of the output from latch 201 of the input circuitry 200, node 110 is pulled-down to logic-0 via the ground GND while the B-clock remains at logic-1 since the scan input circuit 122 is thereby active. As a result, node 129 rises to logic-1 and feedback node 136 and output node 148 fall to logic-0 via inverter 137 and 147, respectively. When the B-clock falls back to logic-0, nodes 129, 136, 148, which are within the static logic circuitry 104, retain the foregoing logic states as a result of gate circuit 138 becoming active via switches 139, 140, 141.

In light of the description herein, it should be apparent that the scannable LSDL circuit 100 can be thoroughly tested by evaluation of its functional inputs 107, 108 and its scan input (s) 109. It should further be apparent that the operation of the scannable LSDL circuit 100 can be evaluated without respect to the combinational logic circuit 106, e.g., by scan inputs, or the entire scannable LSDL circuit 100 (i.e., including combinational logic circuit 106) can be evaluated via the functional inputs 107, 108 that can be defined, e.g., by scan operation or functional patterns. Thus, the inclusion of switches 114, 123, 124, 133, 139 in the scannable LSDL circuit 100 provides a fully scannable LSDL circuit configuration with minimal additional circuitry that can be scanned according to LSSD mode or other scan modes without impacting the benefits of the LSDL configuration.

It should be understood that the various switches, devices, and circuitry described herein may be implemented by various types of transistors, such as field effect transistors (FETs), including complementary metal oxide semiconductor (CMOS) FETs. Additionally, the exemplary scannable LSDL circuit 100 and input circuitry 200 are illustrated and described with respect to various components, modules, etc. for exemplary purposes. For example, the combinational logic circuit 106, pre-charge circuit 112, keeper circuit 118, etc. are described to include certain elements in certain configurations. However, it should be understood that other variations, combinations, or integrations of such elements that provide the same features, functions, etc. are included within the scope of embodiments of the invention. For example, the order of switches connected in series or in parallel may be varied accordingly while maintaining the same functionality.

The circuit as described above can be part of a design for an integrated circuit chip. This chip design can be created in a graphical computer programming language and stored in a computer storage medium (such as a disk, tape, physical hard drive, or virtual hard drive, such as in a storage access network). If the chip designer does not fabricate chips or the photolithographic masks used to fabricate chips, the designer may transmit the resulting design by physical means (e.g., by providing a copy of the storage medium storing the design) or electronically (e.g., through the Internet) to the corresponding entity, directly or indirectly. The stored design can then be converted into an appropriate format (e.g., GDSII) for the fabrication of photolithographic masks, which typically include multiple copies of the chip design to be formed on a wafer. The photolithographic masks can be utilized to define areas of the wafer (and/or the layers thereon) to be etched or otherwise processed to fabricate chips.

The resulting integrated chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has surface interconnections and/or buried connections). In any case, the chip is then integrated with other chips, discrete circuit elements, and/or other signal processing devices as part of either (a) any intermediate product, such as a motherboard, or (b) an end product. The end product can be any product that includes integrated circuit chips, ranging from toys and other low-end applications to advanced computer products having a display, a keyboard or other input device, and a central processor.

While exemplary embodiments of the invention have been described, it will be understood that those skilled in the art, both now and in the future, may make various improvements and enhancements which fall within the scope of the claims that follow. These claims should be construed to maintain the proper protection for the invention first described.

What is claimed is:

1. A scannable limited switch dynamic logic (LSDL) circuit, comprising a first circuit that comprises:
   a data input and a data output;
   a combinational logic circuit in communication with the data input;
   a pre-charge circuit in communication with the combinational logic circuit, the pre-charge circuit comprising:
      a first p-type switch that includes a gate terminal connected to a first test clock and a first source/drain terminal connected to a voltage source; and
      a second p-type switch that includes a gate terminal connected to a first functional clock, a first source/drain terminal connected to a second source/drain terminal of the first p-type switch, and a second source/drain terminal connected to the combinational logic circuit via an intermediate node;
   a footer circuit in communication with the combinational logic, the footer circuit comprising an n-type switch that includes a gate terminal connected to the first functional clock, a first source/drain terminal connected to a ground, and a second source/drain terminal connected to the combinational logic circuit;
   a keeper circuit in communication with the combinational logic circuit and the pre-charge circuit, the keeper circuit comprising:
      an inverter that includes an input connected to the combinational logic circuit and the pre-charge circuit via the intermediate node; and
      a p-type switch that includes a gate terminal connected an output of the inverter, a first source/drain terminal connected to the voltage source, and a second source/drain terminal connected to the intermediate node;
   a scan input connected to the data input;
   a scan input circuit in communication with the scan input, the combinational logic circuit, the pre-charge circuit, and the keeper circuit, the scan input circuit comprising:
      a first n-type switch that includes a gate terminal connected to the scan input and a first source/drain terminal connected to the ground; and
      a second n-type switch that includes a gate terminal connected to the first test clock, a first source/drain terminal connected to a second source/drain terminal of the first n-type switch, and a second source/drain terminal connected to the combinational logic circuit, the pre-charge circuit, and the keeper circuit via the intermediate node;
   a modified inverter circuit in communication with the combinational logic circuit, the pre-charge circuit, the keeper circuit, and the scan input circuit, the modified inverter circuit comprising:

a p-type switch that includes a gate terminal connected to the intermediate node and a first source/drain terminal connected to the voltage source; and an n-type switch that includes a gate terminal connected to the intermediate node and a first source/drain terminal connected to a second source/drain terminal of the p-type switch via an internal node;

a parallel gate circuit in communication with the modified inverter circuit, the parallel gate circuit comprising a plurality of n-type switches each including a first source/drain terminal connected to a second source/drain terminal of the n-type switch of the modified inverter circuit and a second source/drain terminal connected to the ground, wherein a first of the plurality includes a gate terminal connected to the first functional clock and a second of the plurality includes a gate terminal connected to the first test clock;

a series gate circuit in communication with the modified inverter circuit and the parallel gate circuit, the series gate circuit comprising a plurality of p-type switches connected in series between the voltage source and the modified inverter via their source/drain terminals and in communications with the parallel gate circuit, the first test clock, and the first functional clock via their gate terminals;

a feedback inverter that includes an input connected to the modified inverter circuit and the series gate circuit via an internal node and an output connected to the series gate circuit and the parallel gate circuit via a feedback node; and an output buffer comprising an inverter that includes an input connected to the internal node and an output connected to the data output.

2. The scannable LSDL circuit of claim 1, wherein the series gate circuit comprises:

a first p-type switch that includes a gate terminal connected to the first test clock and a first source/drain terminal connected to the voltage source;

a second p-type switch that includes a first source/drain terminal connected to a second source/drain terminal of the first p-type switch, and a gate terminal connected via the feedback node to a gate terminal of a third of the plurality of n-type switches of the parallel gate circuit; and a third p-type switch that includes a gate terminal connected to the first functional clock, a first source/drain terminal connected to a second source/drain terminal of the second p-type switch, and a second source/drain terminal connected to the modified inverter via the internal node.

3. The scannable LSDL circuit of claim 1, wherein the series gate circuit comprises:

a first p-type switch that includes a first source/drain terminal connected to the voltage source and a gate terminal connected via the feedback node to the gate terminal of the third of the plurality of n-type switches of the parallel gate circuit; and a second p-type switch that includes a gate terminal connected to the logic-OR combination of the first functional clock and the first test clock, a first source/drain terminal connected to a second source/drain terminal of the first p-type switch, and a second source/drain terminal connected to the modified inverter via the internal node.

4. The scannable LSDL circuit of claim 1, further comprising additional inputs in communication with the combinational logic circuit, wherein the additional inputs and the data input are also in communication with an input circuitry comprising a plurality of latch circuits each including a data input, a scan input, and an output, wherein:

a first, second, fourth, and sixth latch circuit of the plurality further include a functional clock input connected to a second functional clock and a test clock input connected to a second test clock;

a third, fifth, and seventh latch circuit of the plurality further include a functional clock input connected to a third functional clock and a test clock input connected to a third test clock;

the output of the first latch circuit is connected to the data input of the first circuit;

the output of the second latch circuit is connected to a first of the additional inputs and to the scan input of the third latch circuit;

the output of the third latch circuit is connected to a second of the additional inputs and to the scan input of the fourth latch circuit;

the output of the fourth latch circuit is connected to a third of the additional inputs and to the scan input of the fifth latch circuit;

the output of the fifth latch circuit is connected to a fourth of the additional inputs and to the scan input of the sixth latch circuit;

the output of the sixth latch circuit is connected to a fifth of the additional inputs and to the scan input of the seventh latch circuit; and the output of the seventh latch circuit is connected to a sixth of the additional inputs.

5. The scannable LSDL circuit of claim 4, wherein at least one of the plurality of latch circuits has the same configuration as the first circuit.

6. The scannable LSDL circuit of claim 4, wherein the first, second, and third functional clocks and the first, second, and third test clocks have an operational timing relationship that configures the scannable LSDL circuit to be scanned according to a general scan mode or a level sensitive scan design (LSSD) mode.

* * * * *